United States Patent [19]

Bruen et al.

[11] Patent Number: 4,875,869
[45] Date of Patent: Oct. 24, 1989

[54] BACKPLANE WITH ASSOCIATED HANDLING MEANS

[75] Inventors: Johannes Bruen, Erlangen; Hans-Peter Latussek, Feucht, both of Fed. Rep. of Germany

[73] Assignee: Siemens Aktiengesellschaft, Munich, Fed. Rep. of Germany

[21] Appl. No.: 170,146

[22] Filed: Mar. 18, 1988

[30] Foreign Application Priority Data

Mar. 20, 1987 [DE] Fed. Rep. of Germany ....... 3709113

[51] Int. Cl.$^4$ ........................ H01R 9/22; H01R 13/70
[52] U.S. Cl. ..................................... 439/189; 361/407
[58] Field of Search ............................ 439/55, 59–62, 439/92, 101, 108, 188, 189; 361/407, 413, 415, 392, 393; 200/51.1, 61.19

[56] References Cited

U.S. PATENT DOCUMENTS 4,070,557  1/1978  Ostapovitch ........................ 439/188

FOREIGN PATENT DOCUMENTS 0004899  4/1979  European Pat. Off. .
0195955  3/1986  European Pat. Off. .
2233578  1/1973  Fed. Rep. of Germany .
8410261  7/1981  Fed. Rep. of Germany .
2525065  10/1983  France .
1523136  8/1978  United Kingdom .

OTHER PUBLICATIONS

IEE, Journal of Electronic Engineering, Band 17, Nr. 157, Jan. 1980.

Primary Examiner—Neil Abrams
Attorney, Agent, or Firm—Kenyon & Kenyon

[57] ABSTRACT

A backplane has several socket connectors arranged parallel side by sde on the side facing a module and at least one bus having at least one bus line. A spring contact is attached to a bus contact pin of each socket connector of a bus on the side of the backplane that faces away from the modules. The contact pin of the spring contact adjacent to the bus contact pin of each socket connector is electrically connected to a corresponding bus contact pin. The second contact pin of each pin contact is electrically connected to the others with the bus line. The connection of each spring contact can be controlled with handling means. Modules can be separated from the part of the bus that goes beyond the modules without requiring that the modules be pulled from their plug-in locations on a module carrier.

5 Claims, 1 Drawing Sheet

BACKPLANE WITH ASSOCIATED HANDLING MEANS

RELATED APPLICATIONS

Of interest to the present application are copending applications titled "Backplane Having a Jumper Plug to Connect Socket Connectors to a Bus Line", Ser. No. 170,766, "Backplane Having A Movable Contact Means", Ser. No. 170,147, and "Backplane for Supporting Removable Modules", Ser. No. 170,145, all of which have the same assignee and filing date as the present application.

BACKGROUND OF THE INVENTION

1. Field of the Invention

The present invention relates to a backplane that has several socket connectors arranged in parallel, side by side on a side of the backplane that faces the module. The socket connectors have pins on a side that faces away from the module and form a pin field. At least one bus consists of at least one bus line.

2. Description of Related Art

Backplanes are commercially available and are known, for instance, as VME bus boards. The VME bus is a standardized bus which is responsible for fast data traffic between the most important components of a bus system. The bus structure forms the connecting bars between the building blocks and modules of a micro or minicomputer system. The bus structures also varies according to the system components used and the desired performance. The structure influences the performance of the overall system because the entire data exchange takes place via s such bus systems. The data exchange takes place, for instance, in a 8-, 16- or 32-bit format. For example, 8, 16 or 32 bus line systems interconnect the individual modules of a bus system. A fault caused by a short circuit of an output driver with the supply voltage of a bus participant can block the entire bus system. A diagnostic routine can localize the defective bus participant for many types of faults. However, some types of faults can be determined only by sequentially separating all bus participants from the bus until the defective participant is found and the trouble corrected. The entire function of the participant concerned is put out of operation when the individual bus participants are pulled out of their plug-in locations in a module carrier. This fault isolation process leads to down time.

SUMMARY OF THE INVENTION

It is an object of the invention to develop an improved backplane that enables at least one module to be separated from a bus having several modules without having to pull out the module from its place in a module carrier.

According to the present invention, a spring contact is assigned to a bus contact pin of each socket connector of a bus. The spring contacts are attached on the side of the backplane facing away from the modules. The contact pin of the spring contact adjacent to the bus contact pin of each socket connector is electrically connected to the associated bus contact pin of each socket connector. The second contact pin of each spring contact are electrically connected with the bus line. Handling means control the contacting of each spring contact.

In contrast to other backplanes, the bus lines of the present invention do not interconnect the bus cotact pin of several socket connectors, but rather interconnect the second contact pin of each spring contact. The first contact pins of these spring contacts are electrically connected to the corresponding bus contact pins of each socket connector. The connection can be controlled by handling means. Thus, it faulty modules can be separated from the bus that goes beyond the modules without having to pull the module out of the module carrier. All other functions of this module carrier are disabled if the faulty module is pulled out.

The handling means comprises pins of insulating material. The pins have contact regions that are electrically conducting. These pins are always plugged-in between the two contact pins of the spring contacts. The respective bus contact pin of the socket connector is thereby electrically connected to a bus line. The connection of each spring contact can be controlled by inserting or pulling the handling means. The bus contacts of each socket connector can be electrically connected to the bus conductors of the bus or can be separated therefrom.

One advantageous embodiment electrically connects the contact pins of the spring contacts to each other using their mutual spring force. This arrangement requires only one handling means to separate the contact springs. Thus, only one handling means is required in a faulty module in the bus system that goes beyond the modules. All modules present in the bus system can be sequentially separated from the bus using the same handling means when localizing faults without having to pull the modules out of the module carrier.

DETAILED DESCRIPTION

Figure 1:
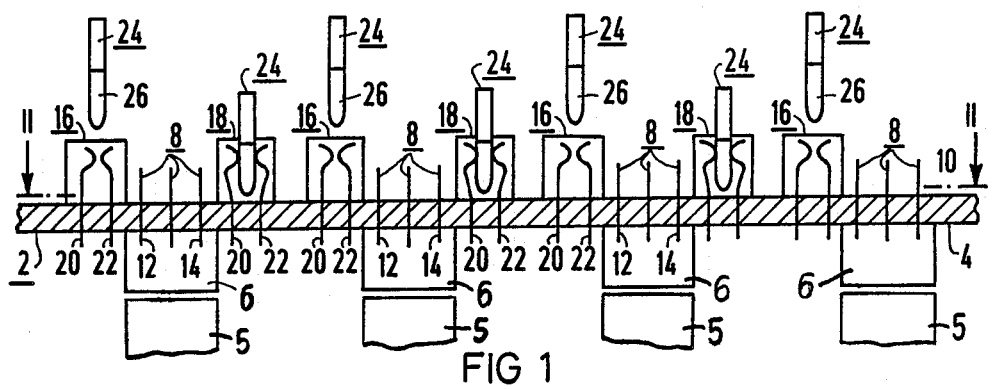
FIG. 1 shows a cross section through a backplane having two buses.

FIG. 1 shows a longitudinal cross section through a backplane 2 that has several socket connectors 6 on the side 4 facing the module 5. The pins 8 of the socket connectors 6 form a pin field on side 10 facing away from the modules. Each bus contact pin 12 and 14 of each socket connector 6 has assigned a spring contact 16 or 18. The spring contacts 16 and 18 are arranged on the side 10 of the backplane 2 facing away from the modules. Each spring contact 16 and 18 contains two contact pins 20 and 22 which are electrically connected by handling means 24. Handling means 24 can comprise a pin of insulating material with a contact region 26 formed from a conducting layer. Handling means 24 are plugged into spring contacts 18 so that contacts 20 and 22 of these spring contacts 18 are electrically connected.

Figure 2:
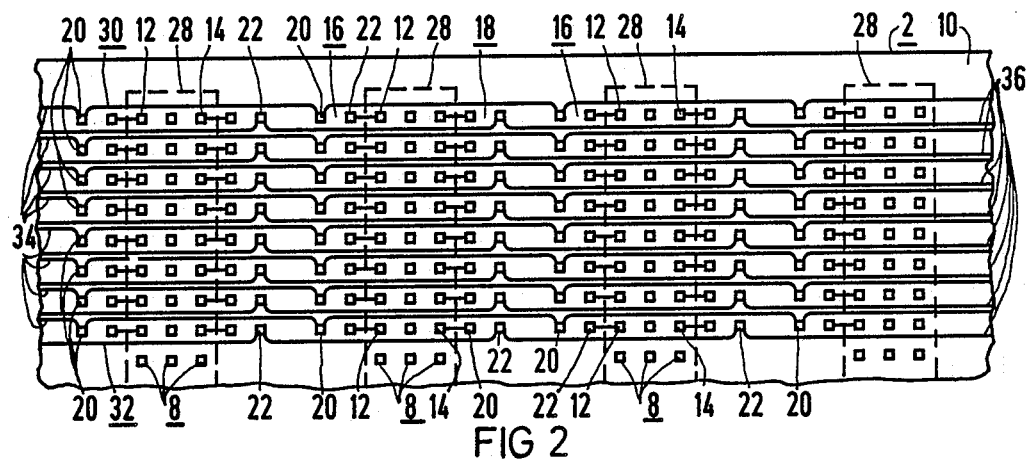
FIG. 2 shows a top view of the side of the backplane facing away from the modules along cross section II—II as shown in FIG. 1.

FIG. 2 shows a top view of side 10 of the backplane 2 facing away from the modules along cross section II—II of FIG. 1. The socket connectors 6 on side 4 of the backplane 2 facing the modules are shown with dashed line 28. Socket connectors 6 can be 96-pole socket connectors with pins 8 arranged in three rows. In addition, buses 30 and 32 have eight bus lines 34 and 36, respectively. Bus 32 is redundant with bus 30. The bus contact pins 12 of each socket connector 6 of the bus 30 belong to the contact pins 8 of an outer contact pin row of each socket connector 6. Each bus contact pin 12 has a corresponding spring contact 16. Each contact pin 22 of the spring contact 16 is electrically connected directly to the bus contact pin 12. The eight contact pins 20 of the spring contact 16 are electrically connected to the eight bus lines 34 of the bus 30. Spring contacts 18 are assigned to the bus contact pins 14 that belong to the pins 8 of an outer row of contact pins of each socket connector 6. The contact pins 20 of these spring contacts 18 are each electrically connected to the corresponding bus contact pins 14. The eight contact pins 22 of these spring contacts 18, however, are electrically connected to the eight bus lines 36 of the bus 32. As is shown in FIG. 1, the handling means 24 is plugged into the spring contact 18. The handling means 24 can comprise an insulating plate with a conducting zone that has a length corresponding to the bus format, for instance, 8, 16 or 32 bus lines.

In operation, all bus participant modules of the backplane 2 are connected with the handling means 24 to the two buses 30 and 32. The data transfer between the individual bus participant modules takes place on bus 30. If a fault occurs in a module that interferes with this bus 30, one can switch to the bus 32 since buses 30 and 32 are redundant. The system thus stays in operation. The fault localization takes place on the disturbed bus 30 by separating the modules from bus 30. The handling means 24 are effectively sequentially pulled from the spring contacts 16 and again reinserted. The blocking of the bus 30 is corrected in conjunction with a suitable test routine. The localized defective bus-participant module can then be replaced. This indirect coupling of the bus participant module to the module-extending process permits separating the individual modules from the buses 30 and 32 at any time without having to pull the module from its plug-in location on the module carrier. The functions performed by the module remain available so that the on line time of the system is increased.

Figure 3:
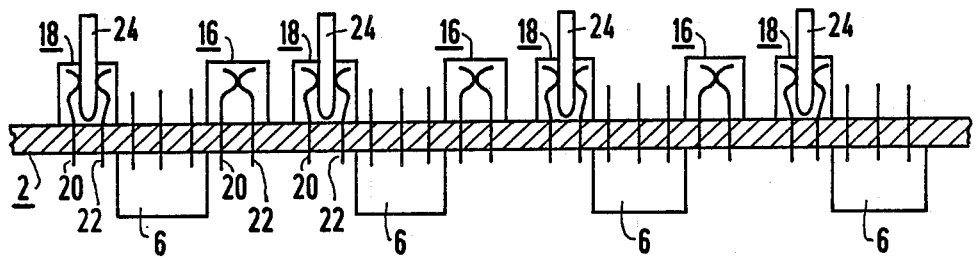
FIG. 3 shows a further embodiment of a backplane according to the present invention.

The backplane 2 shown in FIG. 3 essentially corresponds to the backplane 2 shown in FIG. 1. Closed contacts are provided as the spring contact 16 or 18. In the closed contact, the contact of the contact pins 20 and 22 is made by using their spring forces. The connection of contact pins 20 and 22 to spring contacts 16 and 18 can be controlled with handling means 24. Handling means 24 also can have an insulating pin or insulating plate depending on the format of the bus. In this embodiment, only one handling means 24 is required if a bus participant module is faulty and blocks bus 30 or 32. According to the embodiment shown in FIG. 1, two handling means 24 are required for each module of the bus system so that the backplane 2 is ready for operation. The backplane 2 is ready for operation in the embodiment shown in FIG. 3 without handling means 24. In addition, the fault localization is facilitated since, in the simplest case, only one handling means 24 needs to be sequentially plugged into the closed contacts of the blocked bus 30 or 32.

What is claimed is:

1. A backplane for a subrack having modules, comprising:
    a least one bus having at least one bus line;
    a plurality of socket connectors arranged in parallel next to each other on a side of the backplane facing the modules, each socket connector having at least one bus contact pin;
    a spring contact for each bus contact pin of each socket connector of said at least one bus disposed on a side of the backplane that faces away from the modules, each spring contact having first and second resilient contact pins, said first contact pin of each spring contact being adjacent the bus contact pin of each socket connector and electrically connectable to a corresponding contact pin, said second contact pin of each spring contact being electrically connected with said at least one contact bus line; and
    handling means for controlling the electrical connection of said first and second spring contact connections of each spring contact.

2. A backplane as claimed in claim 1, wherein said handling means comprises a pin of insulating material having a contact area that is electrically conducting.

3. A backplane as claimed in claim 1, wherein said contact pins of said spring contact are electrically connected to each other by their spring force.

4. A backplane as claimed in claim 3, wherein said handling means comprises an insultating pin.

5. A backplane as claimed in claim 1, wherein:
    said at least one bus each comprises several bus lines; and
    said handling means comprises an insulating plate that has a contact area with a conducting layer.

* * * * *